United States Patent
Yu et al.

(10) Patent No.: US 10,095,420 B2
(45) Date of Patent: Oct. 9, 2018

(54) STORAGE DEVICE COMMUNICATING WITH SPECIFIC PATTERN AND OPERATING METHOD THEREOF

(71) Applicant: SAMSUNG ELECTRONICS CO., LTD., Suwon-si, Gyeonggi-Do (KR)

(72) Inventors: Jae-Sung Yu, Seoul (KR); Kui-Yon Mun, Hwaseong-si (KR); Youngwook Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 137 days.

(21) Appl. No.: 14/994,168

(22) Filed: Jan. 13, 2016

(65) Prior Publication Data

US 2016/0239220 A1   Aug. 18, 2016

(30) Foreign Application Priority Data

Feb. 13, 2015  (KR) .................. 10-2015-0022302

(51) Int. Cl.
| | |
|---|---|
| *G06F 12/00* | (2006.01) |
| *G06F 3/06* | (2006.01) |
| *G06F 13/16* | (2006.01) |
| *G11C 29/56* | (2006.01) |
| *G11C 29/02* | (2006.01) |

(52) U.S. Cl.
CPC .......... *G06F 3/0611* (2013.01); *G06F 3/0619* (2013.01); *G06F 3/0655* (2013.01); *G06F 3/0688* (2013.01); *G06F 13/1689* (2013.01); *G11C 29/021* (2013.01); *G11C 29/023* (2013.01); *G11C 29/028* (2013.01); *G11C 29/56004* (2013.01)

(58) Field of Classification Search
None
See application file for complete search history.

(56) References Cited

U.S. PATENT DOCUMENTS

| | | | |
|---|---|---|---|
| 6,003,118 | A  | 12/1999 | Chen |
| 6,323,705 | B1 | 11/2001 | Shieh et al. |
| 6,584,021 | B2 | 6/2003  | Heyne et al. |
| 6,731,163 | B2 | 5/2004  | Huckins et al. |
| 6,895,522 | B2 | 5/2005  | Johnson et al. |

(Continued)

FOREIGN PATENT DOCUMENTS

| | | |
|---|---|---|
| JP | 2007-226308 A | 9/2007 |
| JP | 2011-141781 A | 7/2011 |

(Continued)

*Primary Examiner* — Brian Peugh
(74) *Attorney, Agent, or Firm* — Volentine, Whitt & Francos, PLLC

(57) ABSTRACT

A storage device includes a memory device configured to store data and a memory controller connected to the memory device through a data strobe line and a plurality of data lines. The storage device adds a predetermined specific pattern in front of data and processes data input following the specific pattern as valid data during a read or write operation. The specific pattern is provided in alignment with a data strobe signal (DQS) latency cycle. The memory controller detects a specific pattern input from the memory device during a read operation and processes data input following the specific pattern as valid data when the detected specific pattern matches an internally stored specific pattern.

20 Claims, 15 Drawing Sheets

(56) References Cited

U.S. PATENT DOCUMENTS

| | | |
|---|---|---|
| 7,028,208 B2 | 4/2006 | Johnson et al. |
| 7,321,525 B2 | 1/2008 | Matsui |
| 7,372,745 B2 | 5/2008 | Kitamura |
| 7,405,984 B2 * | 7/2008 | Hughes .................... G11C 7/04 365/189.07 |
| 7,679,133 B2 | 3/2010 | Son et al. |
| 7,719,904 B2 | 5/2010 | Lee |
| 7,755,955 B2 | 7/2010 | Seo |
| 7,778,094 B2 | 8/2010 | Park et al. |
| 7,889,581 B2 | 2/2011 | Wakasa |
| 7,999,589 B2 | 8/2011 | Lin |
| 8,018,260 B2 | 9/2011 | Papageorgiou et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2004/0034736 A1 * | 2/2004 | Horn ...................... G06F 3/0607 711/114 |
| 2010/0039875 A1 * | 2/2010 | Stott ........................ G11C 7/02 365/193 |
| 2011/0233648 A1 | 9/2011 | Seol et al. |
| 2013/0064025 A1 * | 3/2013 | Chen .................... G06F 13/1689 365/193 |
| 2013/0262907 A1 | 10/2013 | Zitlaw |
| 2014/0269119 A1 | 9/2014 | Na |
| 2014/0281193 A1 | 9/2014 | Schaefer |

FOREIGN PATENT DOCUMENTS

| | | |
|---|---|---|
| JP | 2012-088852 A | 5/2012 |
| KR | 10-2010-0031373 A | 3/2010 |
| KR | 10-2011-0138209 A | 12/2011 |

\* cited by examiner

FIG. 7
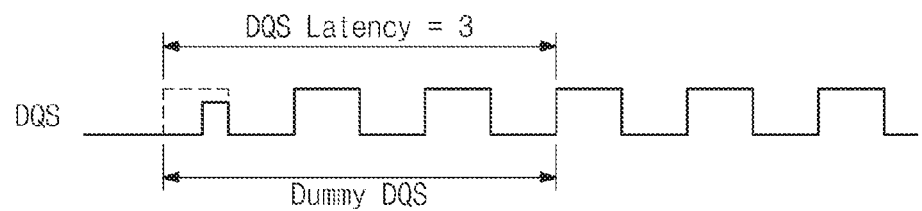
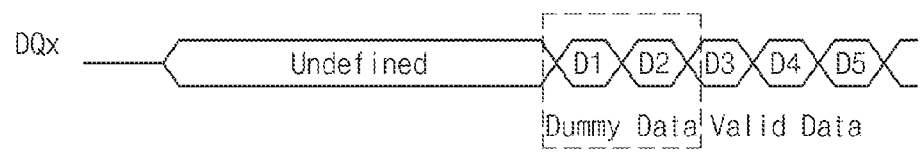
FIG. 8
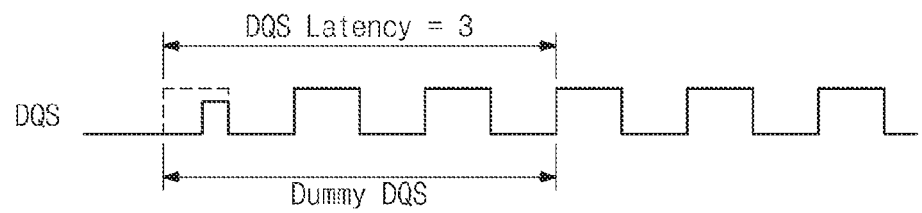
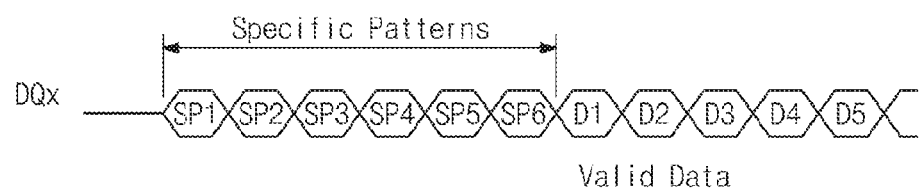

FIG. 11
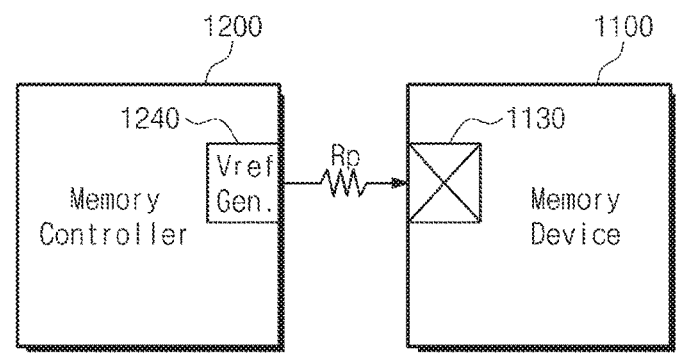
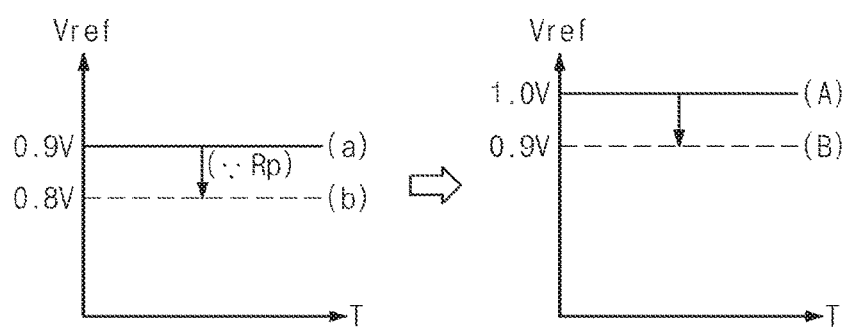
FIG. 12
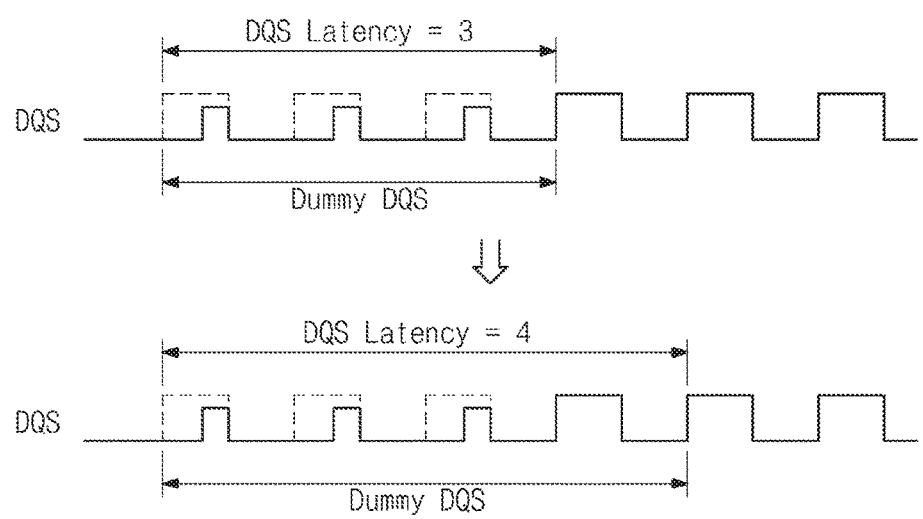

STORAGE DEVICE COMMUNICATING WITH SPECIFIC PATTERN AND OPERATING METHOD THEREOF

CROSS-REFERENCE TO RELATED APPLICATIONS

This US non-provisional patent application claims priority under 35 USC § 119 to Korean Patent Application No. 10-2015-0022302, filed on Feb. 13, 2015, the entirety of which is hereby incorporated by reference.

BACKGROUND

The present disclosure relates to semiconductor memory devices and, more particularly, to a storage device including a semiconductor memory device and an operating method thereof.

In general, semiconductor memory devices may be classified into volatile memory devices such as DRAMs and SRAMs and nonvolatile memory devices such as EEPROMs, FRAMs, PRAMs, RRAMs, MRAMs, and flash memories. Volatile memory devices lose their stored data when their power supplies are interrupted, while nonvolatile memory devices retain their stored data even when their power supplies are interrupted. In particular, a flash memory has advantages such as high program speed, low power consumption, and large data storage capacity. Therefore, storage devices based on a flash memory have been widely used.

Storage devices based on a flash memory include a solid state drive (SSD) that has been replacing a hard disk drive (HDD) and a memory card such as an SD card and an MMC. Since such a semiconductor memory device is fabricated with a small size, it may be embedded in a handheld electronic device. An embedded storage device may be, for example, an embedded SSD (eSSD) or an embedded MMC (eMMC). The eSSM may be used in a laptop computer, a tablet PC or an e-book, and the eMMC may be used in a mobile device.

Such a storage device includes a flash memory and a memory controller. Data is transmitted between the flash memory and the memory controller at high speed. The storage device uses a data strobe signal DQS to stably transmit the data. However, a pulse width of the data strobe signal DQS may be reduced by resistance of a signal line or the like. If the pulse width of the data strobe signal DQS becomes narrow, data may not be stably transmitted.

SUMMARY

The present disclosure relates to a storage device and an operating method of the storage device.

A storage device according to example embodiments of the disclosure includes a storage device configured to store data and a memory controller connected to the memory device through a data strobe line and a plurality of data lines. The storage device adds a predetermined specific pattern in front of data and processes data input following the specific pattern as valid data during a read or write operation.

In example embodiments, the specific pattern may be provided in alignment with a data strobe signal (DQS) latency cycle. The memory controller may detect a specific pattern input from the memory device during a read operation and process data input following the detected specific pattern as valid data when the detected specific pattern matches an internally stored specific pattern.

In example embodiments, the memory controller may recognize a mismatch of the specific pattern as a malfunction and perform a random-out operation or stop performing the random-out operation when the specific pattern mismatches. The memory controller may perform the random-out operation after changing a data input/output speed with the memory device, changing a reference voltage provided to the memory device, changing a DQS latency cycle or resetting the memory device.

In example embodiments, the memory controller may detect a specific pattern input from the memory controller during the write operation and process data input following the specific pattern as valid data when the detected specific pattern matches an internally stored specific pattern.

In example embodiments, the specific pattern may include at least one of a block address, a page address, and a column address provided from the memory controller or a seed value provided from the memory controller. The memory device may recognize a mismatch of the specific pattern as a malfunction, process a program state as a program failure, and provide a pattern mismatch result to the memory controller through a status bit when the specific pattern mismatches.

Example embodiments of the disclosure provide an operating method of a storage device including a memory device configured to store data and a memory controller connected to the memory device through a data strobe line and a plurality of data lines. The operating method includes: generating a specific pattern; providing the specific pattern through the data lines in alignment with a dummy DQS signal; and providing valid data in alignment with a DQS signal after providing the specific pattern. The data input following the specific pattern may be processed as valid data.

A memory device according to example embodiments of the disclosure includes: a data input/output (I/O) circuit and a pattern logic circuit. The data I/O circuit receives a pattern in alignment with a dummy data strobe signal and receives data in alignment with a data strobe signal upon completely receiving the pattern. The pattern logic circuit identifies a pattern match if at least a portion of the received pattern is determined to match a corresponding portion of an expected pattern.

BRIEF DESCRIPTION OF THE DRAWINGS

The forgoing and other features of the disclosure will be described below in more detail with reference to the accompanying drawings that illustrate non-limiting embodiments of the disclosure in which like reference characters refer to like parts throughout the different views. The drawings are not necessarily to scale, emphasis instead being placed upon illustrating principles of the disclosure. In the drawings:

FIGS. 7 and 8 are timing diagrams illustrating the operation of a pattern control logic of the memory device in FIG. 5;

FIG. 11 illustrates an example of varying a reference voltage of the storage device in FIG. 5;

FIG. 12 is a timing diagram summarizing an example of changing a DQS latency cycle of the storage in FIG. 5;

DETAILED DESCRIPTION

Figure 1:
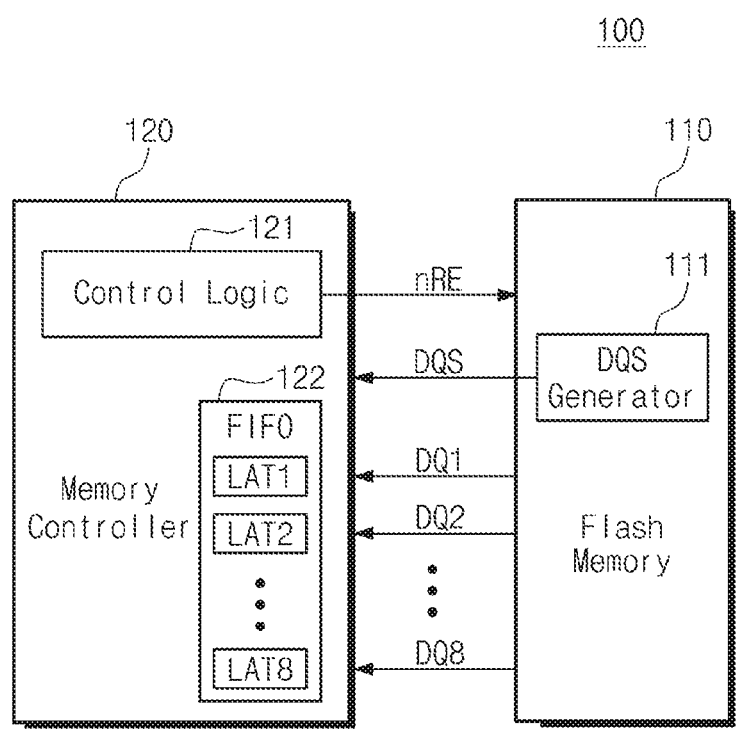
FIG. 1 is a block diagram of a storage device according to example embodiments of the disclosure.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the disclosure to those of ordinary skill in the art. In the drawings, the thicknesses of layers and regions are exaggerated for clarity. Like reference characters and/or numerals in the drawings denote like elements, and thus their description may be omitted.

FIG. 1 is a block diagram of a storage device 100 according to example embodiments of the disclosure. As illustrated, the storage device 100 may include a flash memory 110 and a memory controller 120.

Storage devices based on a flash memory include a solid state drive (SSD) that has been replacing a hard disk drive (HDD) and a memory card such as an SD card and an MMC. Since such a semiconductor memory device is fabricated with a small size, it may be embedded in a handheld electronic device. An embedded storage device may be, for example, an embedded SSD (eSSD) or an embedded MMC (eMMC). The eSSM may be used in a laptop computer, a tablet PC or an e-book, and the eMMC may be used in a mobile device.

Referring to FIG. 1, the memory controller 120 may be connected to the flash memory 110 through a data strobe line and a plurality of data lines. The memory controller 120 may receive a read request from an external device and provide a read enable signal nRE to the flash memory 110, via control logic 121. A DQS generator 111 in the flash memory 110 may receive the read enable signal nRE to generate a data strobe signal DQS. The flash memory 110 may provide the data strobe signal DQS to the memory controller 120 through the data strobe line.

The memory controller 120 may receive the data strobe signal DQS and receive read data from the flash memory 110 through the data lines. Data output signals (e.g., DQ1 to DQ8) may be output in alignment with a rising edge or a falling edge of the data strobe signal DQS. In an example in FIG. 1, 8 bits of data are output each time the data strobe signal DQS transitions once. The output data is sequentially stored in latch circuits LAT1 to LAT8 of a first-in-first-out (FIFO) circuit 122.

Figure 2:
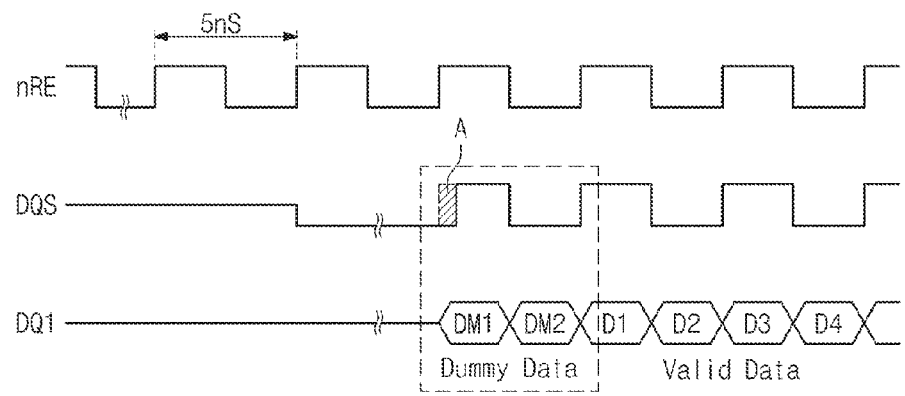
FIGS. 2 and 3 are timing diagrams illustrating a read operation of the storage device in FIG. 1.
Figure 3:
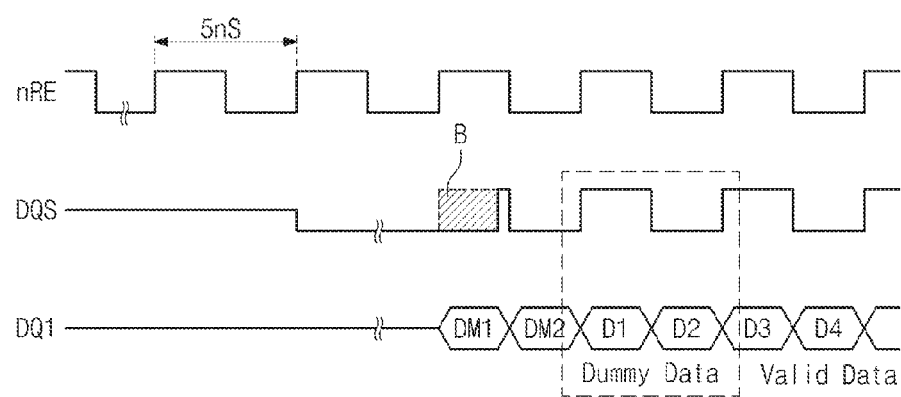

FIGS. 2 and 3 are timing diagrams illustrating a read operation of the storage device 100 in FIG. 1. Among the eight data output signals DQ1 to DQ8 shown in FIG. 1, only a first data output signal DQ1 is shown in FIGS. 2 and 3. The other data signals DQ2 to DQ8 are also transmitted in the same way.

Referring to FIGS. 1 and 2, the read enable signal nRE is provided to the flash memory 110 (see FIG. 1). Hereinafter, an example will be described where one cycle of the read enable signal nRE is 5 ns. After the read enable signal nRE is provided and predetermined time (e.g., about 10 ns) elapses, a data strobe signal DQS is provided to the memory controller 120 (see FIG. 1).

A first high pulse width of the data strobe signal DQS may be narrowed by resistance of a signal line or the like. The high pulse width of the data strobe signal DQS may be narrowed to a degree of a hatched portion A in FIG. 2. Before transmitting a valid DQS signal, the flash memory 110 transmits a dummy DQS signal to cope with a case where a duty rate of the DQS signal does not match. The memory controller 120 disregards dummy data DM1 and DM2 by the dummy DQS signal and sequentially stores only valid data D1 to D4 by the valid DQS signal in the first latch circuit LAT1 of the FIFO circuit 122 (see FIG. 1).

The storage device 100 may set the dummy DQS signal and define the number of dummy DQS cycles in various ways. For example, the storage device 100 may define the number of the dummy DQS cycles using a set feature operation.

The number of dummy DQS cycles is also called a DQS latency cycle. Although the DQS latency cycle is 1 in FIG. 2, it may be set to zero, 2 or more through the set feature operation. When the DQS latency cycle is set to zero (no latency DQS cycle), the memory controller 120 sequentially stores valid data in the first latch circuit LAT1 of the FIFO circuit 122 immediately without dummy data. When the DQS latency cycle is set to 2 or 3, the memory controller 120 processes data input during a second or third cycle of the DQS signal as dummy data and stores the next input valid data in the first latch circuit LAT1.

FIG. 3 is a timing diagram showing an example where the first pulse width of the DQS signal is abnormally narrowed. Due to a defect during a semiconductor fabricating process or interfacial resistance of a signal line, first pulse width of the data strobe signal DQS may become so narrow that the memory controller 120 may not recognize the first pulse width of the DQS signal. In FIG. 3, the hatched portion B shows an example where the first pulse width of the data strobe signal DQS is abnormally narrowed.

In such an abnormal case, the memory controller 120 may not recognize the first pulse of the DQS signal. If the memory controller 120 cannot recognize the first pulse of the DQS signal, it may misunderstand a valid data strobe signal and valid data transmitted subsequently as a dummy data strobe signal and dummy data. That is, the memory controller 120 may store only the valid data D3 and D4 and not the valid data D1 and D2 in the FIFO circuit 122. This problem may also occur during a write operation.

Figure 4:
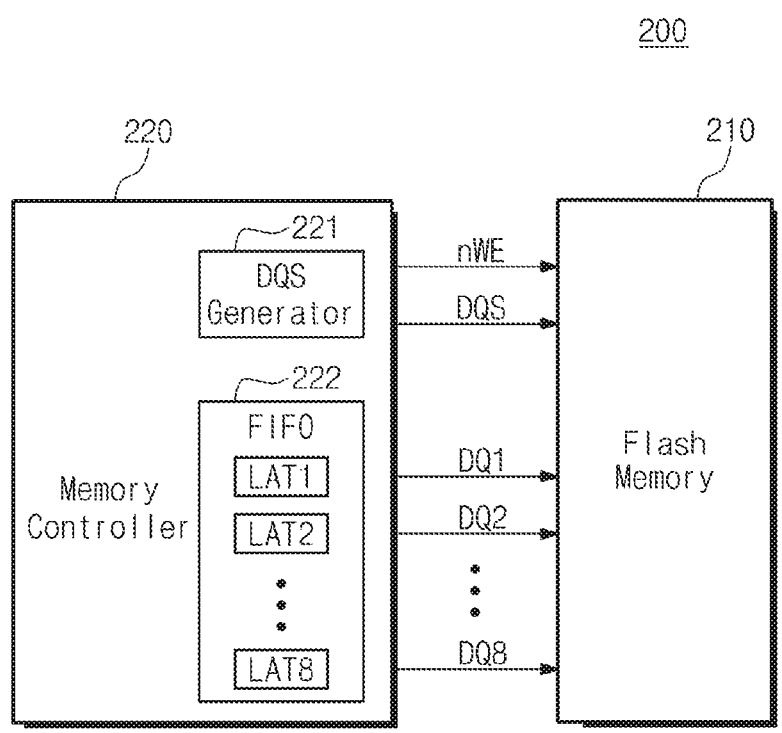
FIG. 4 is a block diagram illustrating a write operation of a storage device.

FIG. 4 is a block diagram illustrating a write operation of a storage device 200. As illustrated, the storage device 200 may include a flash memory 210 and a memory controller 220.

The memory controller 220 may receive a write request from a host and provide a write enable signal nWE to the flash memory 210. A DQS generator 221 in the memory controller 220 may internally generate a data strobe signal. The DQS generator 221 may provide the data strobe signal DQS to the flash memory 210.

The flash memory 210 may receive the data strobe signal DQS and prepare to receive write data from the memory controller 220. The write data may be center-aligned with the data strobe signal DQS to be provided to the flash memory 210. In an example in FIG. 4, 8 bits of data DQ1-DQ8 are provided to the flash memory 210 from latches LAT1-LAT8 of a first-in-first-out (FIFO) circuit 222 each time the data strobe signal DQS transitions once. Even during a write operation, a width of the DQS signal is narrowed and thus the storage device 200 may not transmit data stably.

A storage device according to example embodiments of the disclosure adds a specific pattern in front of valid data to overcome the disadvantage that a width of a DQS signal may be narrowed so as to cause the storage device to misrecognize valid data as dummy data. For example, the storage device sets the dummy data DM1 and DM2 shown in FIG. 3 to a specific pattern and recognizes data input following the specific pattern as valid data.

A storage device according to example embodiments of the disclosure processes data input following a specific pattern as valid data when transmitting and receiving the specific pattern in a dummy DQS cycle. Thus, the storage device may be prevented from mistakenly processing the valid data as dummy data.

Figure 5:
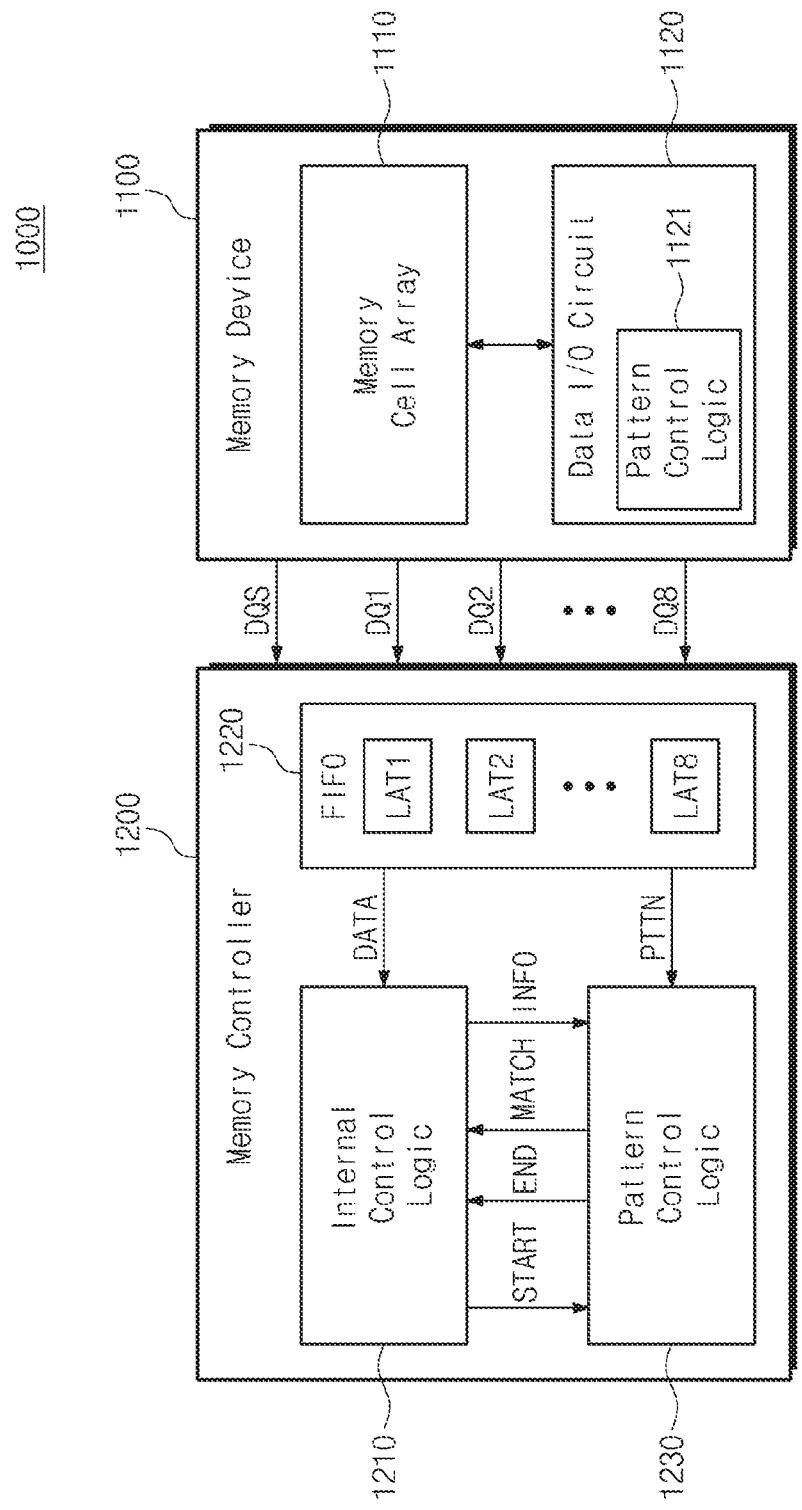
FIG. 5 is a block diagram of a storage device according to example embodiments of the disclosure.

FIG. 5 is a block diagram of a storage device 1000 according to example embodiments of the disclosure. As illustrated, the storage device 1000 may include a memory device 1100 and the memory controller 1200. An operation of providing a specific pattern and data DATA to the memory controller 1200 from the memory device 1100 will now be described with reference to FIG. 5.

The storage device 1000 may include one piece of flash memory or a storage medium such as embedded SSD (eSSD), embedded MMC (eMMC), and universal flash storage (UFS). In addition, the storage device 1000 may include a storage medium based on a nonvolatile memory such as MRAM, PRAM, RRAM, and FRAM or a volatile memory such as DRAM and SRAM.

Continuing to refer to FIG. 5, the memory device 1100 may include a memory cell array 1110 and a data input/output (I/O) circuit 1120. The memory cell array 1110 may include a planar type, in which memory cells are arranged in a direction horizontal to a substrate, and a three-dimensional (3D) type in which memory cells are arranged in a direction perpendicular to the substrate.

In an embodiment of the present disclosure, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Still referring to FIG. 5, the data I/O circuit 1120 may temporarily store data read from the memory cell array 1110. The data I/O circuit 1120 may receive a read enable signal nRE (see FIG. 2) from the memory controller 1200 and provide a data strobe signal to the memory controller after a predetermined time elapses. The data I/O circuit 1120 may provide data DATA to the memory controller 1200 in alignment with a transition of a DQS signal.

The data I/O circuit 1120 may include a pattern control logic 1121. The pattern control logic 1121 may generate or detect a specific pattern. The pattern control logic 1121 may separately include a pattern generator (not shown) to generate a specific pattern and a pattern detector (not shown) to detect a specific pattern.

A specific pattern is a patterned version of data provided in alignment with a transition of a dummy DQS signal and is a known-pattern that the memory device 1100 and the memory controller 120 establish previously. The specific pattern may be an established pattern or may be formed using a block address, a page address, a column address or a seed value. The specific pattern and data may be provided to the memory controller 1200 from the memory device 1100 through data output signals DQ1 to DQ8.

Operations of generating a specific pattern by the data I/O circuit 1120 and providing the specific pattern and read data to the memory controller 1200 by the data I/O circuit 1120 will be described in further detail later with reference to FIGS. 6 and 7.

The memory controller 1200 may sequentially receive the specific pattern and the data from the memory device 1100 and sequentially store the specific pattern and the data in latch circuits LAT1 to LAT8 of a first-in-first-out (FIFO) circuit 1220. A specific pattern PTTN stored in the FIFO circuit 1220 may be provided to the pattern control logic 1230 and data DATA may be provided to internal control logic 1210.

The pattern control logic 1230 may receive a start signal START from the internal control logic 1210 and start a pattern detection operation. The pattern control logic 1230 may provide an end signal END to the internal control logic 1210 when the pattern detection operation is terminated.

When the start signal START is input, the pattern control logic 1230 may inspect whether the specific pattern PTTN input from the FIFO circuit 1220 matches a previously established known-pattern. The pattern control logic 1230 may determine whether a specific pattern matches the known-pattern, based on pattern information INFO input from the internal control logic 1210. The pattern information INFO may include a block address, a page address, a column address, a seed value, and the like.

The pattern control logic 1230 may perform a pattern detection operation and provide a matching signal MATCH of a specific pattern to the internal control logic 1210 as a result of the pattern detection operation. When the specific pattern matches, the internal control logic 1210 may process data DATA input from the FIFO circuit 1220 as valid data.

When the specific pattern mismatches, the internal control logic 1210 may perform an error protection operation. The internal control logic 1210 does not perform an ECC decoding operation to correct a data error but provides a column address to the memory device 1100 to re-perform the read operation. This read operation is also called a random-out operation. When the random-out operation is performed, the internal control logic 1210 may change various operation conditions.

For example, the internal control logic 1210 may perform a random-out operation after decreasing an input/output (I/O) speed. Alternatively, the internal control logic 1210 may perform a random-out operation after adjusting a reference voltage Vref provided to the memory device 1100 from the memory controller and adjusting a DQS latency cycle. Alternatively, the internal control logic 1210 may perform a random-out operation after resetting the memory device 1100. Detailed embodiments of the random-out operation will be described later.

Figure 6:
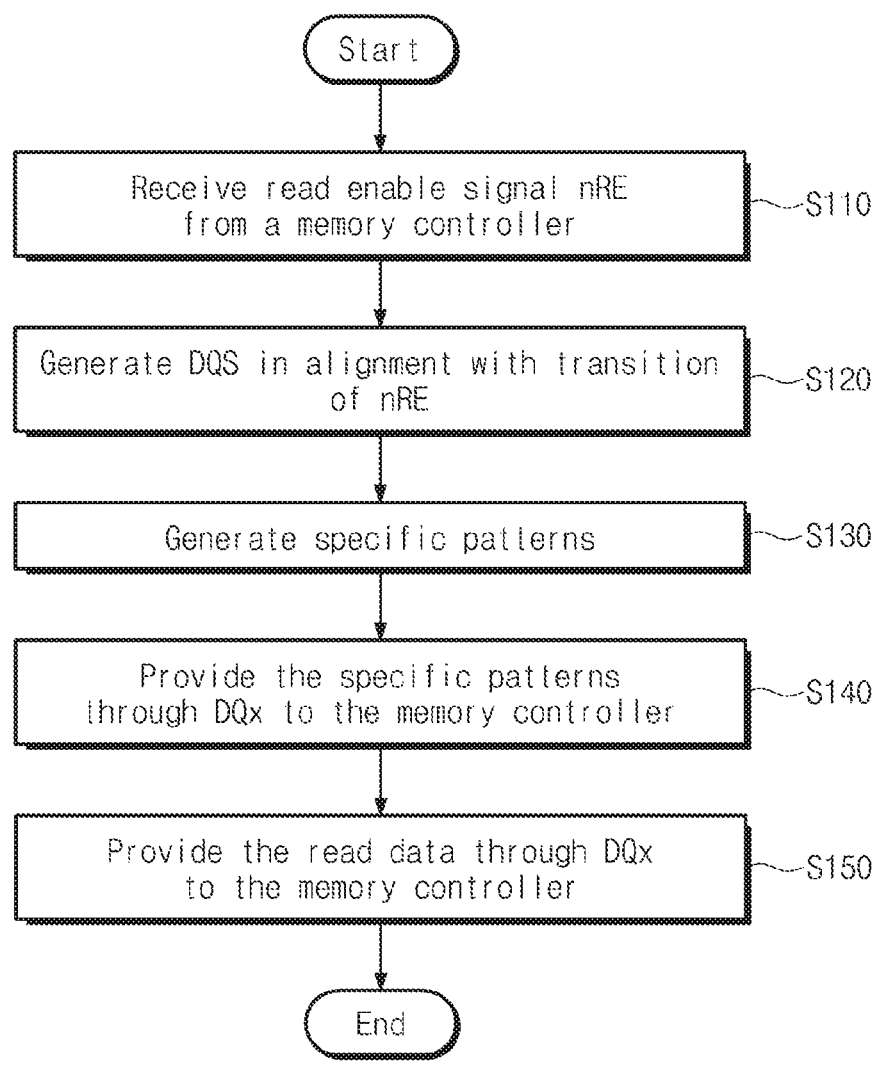
FIG. 6 is a flowchart summarizing the operation of a data input/output circuit of a memory device in FIG. 5.

FIG. 6 is a flowchart summarizing the operation of the data I/O circuit 1120 of the memory device 1000 in FIG. 5. The data I/O circuit 1120 temporarily stores data read from the memory cell array 1110 in an internal buffer circuit (not shown).

The data I/O circuit 1120 receives a read enable signal nRE from the memory controller 1200 (S110).

The data I/O circuit 1120 receives the read enable signal nRE to generate a data strobe signal DQS after a predetermined time elapses (S120). The DQS signal is generated in alignment with a transition of the read enable signal nRE.

The data I/O circuit 1120 generates specific patterns (S130). Specific patterns may be generated using the pattern control logic 1121. The pattern control logic 1121 may generate a specific pattern using a block address, a page address or a column address provided from the memory controller 1200. Alternatively, the pattern control circuit 1121 may generate a specific pattern using data or a seed.

The data I/O circuit 1120 provides the specific pattern to the memory controller 1200 through the data output signals DQ1 to DQ8 (S140). The specific pattern may be provided during a DQS latency cycle in alignment with a dummy DQS signal.

The data I/O circuit 1120 provides read data to the memory controller 1200 through the data output signals DQ1 to DQ8 after providing all the specific patterns (S150). The read data is provided in alignment with the DQS signal.

FIGS. 7 and 8 are timing diagrams illustrating the operation of the pattern control logic 1121 of the memory device 1100 in FIG. 5. The memory device 1100 may add a specific pattern in front of valid data or may not add a specific pattern, according to an operation mode. FIG. 7 shows a case where a specific pattern is not added, and FIG. 8 shows a case where a specific pattern is added in front of valid data. In FIGS. 7 and 8, an example will be described where a DQS latency cycle is 3.

Referring to FIG. 7, the memory device 1100 may generate a data strobe signal DQS in response to a read enable signal nRE. The memory device 1100 may generate a dummy DQS signal of 3 cycles and provide undefined dummy data during a dummy DQS cycle. The memory controller 1200 may recognize data D1 input following the DQS latency cycle as valid data (not shown).

However, the dummy DQS may be severely distorted, as shown in FIG. 7. For example, a first pulse width of the dummy DQS signal may be significantly reduced or a voltage level of the dummy DQS signal may decrease. In this case, the memory controller 1200 may not recognize a first pulse of the dummy DQS signal. In this case, the memory controller 1200 may misrecognize first and second valid data D1 and D2 as dummy data. The memory controller 1200 may recognize third data D3 and subsequent data as valid data.

Referring to FIG. 8, the memory device 1100 may provide specific patterns SP1 to SP6 to the memory controller 1200 through a data output signal DQx in alignment with a transition of a dummy DQS signal. The memory device 1100 may provide valid data in alignment with a transition of a DQS signal after providing all the specific patterns SP1 to SP6.

The memory device 1100 may add a specific pattern in front of valid data, as shown in FIG. 8. The pattern control logic 1230 may determine pattern match not only when all of the specific patterns SP1 to SP6 match but also even when only some of the specific patterns SP1 to SP6 match (e.g., SP5 and SP6) match. That is, the pattern control logic 1230 may process data input following a specific pattern as valid data when the fifth and sixth specific patterns SP5 and SP6 match although the first specific pattern SP1 mismatches.

Figure 9:
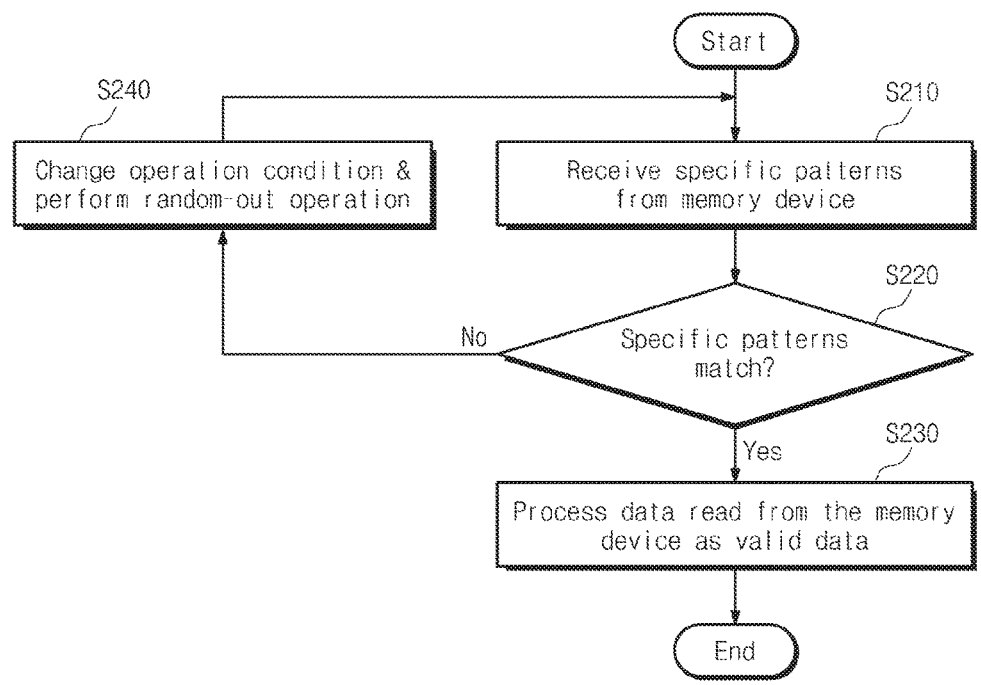
FIG. 9 is a flowchart summarizing the operation of a memory controller in FIG. 5.

According to the method illustrated in FIG. 8, even when a first pulse width of a dummy DQS signal is significantly reduced or a voltage level of the dummy DQS signal decreases, the memory controller 1200 may recognize first data D1 and subsequent data as valid data. FIG. 9 is a flowchart summarizing the operation of the memory controller 1200 in FIG. 5.

The memory controller 1200 receives specific patterns from the memory device 1100 and sequentially stores the received specific patterns in the latch circuits LAT1 to LAT8 of the FIFO circuit 1220 (S210). The specific patterns PTTN stored in the FIFO circuit 1220 are provided to the pattern control logic 1230.

The pattern control logic 1230 performs a pattern detection operation and inspects whether the input specific patterns PTTN match a previously established known-pattern (S220). The pattern control logic 1230 may determine whether the specific patterns PTTN match, based on pattern information INFO input from the internal control logic 1210. The pattern information INFO may include a block address, a page address, a column address, a seed, and the like.

The pattern control logic 1230 may provide a matching signal when all the specific patterns SP1 to SP6 match. Alternatively, the pattern control logic 1230 may provide the matching signal to the internal control logic 1210 even when only some of the specific patterns SP1 to SP6 (e.g., SP5 and SP6) match. That is, the pattern control logic 1230 may provide the matching signal to the internal control logic 1210 when the fifth and sixth specific patterns SP5 and SP6 match although the first specific pattern SP1 mismatches.

The internal control logic 1210 processes data DATA read from the memory device 1100 as valid data when a specific pattern matches (S230). The pattern control logic 1230 of the memory controller 1200 may detect the specific patterns SP1 to SP6 during a dummy DQS cycle and provide a matching signal MATCH to the internal control logic 1210. The internal control logic 1210 may recognize data D1 input following the specific patterns SP1 to SP6 as valid data when the specific pattern matches. Thus, the memory controller 1200 may accurately read valid data irrespective of the distortion of a dummy DQS signal.

The internal control logic 1210 changes operation conditions and performs a random-out operation when the specific pattern does not match (S240). The internal control logic 1210 does not perform an ECC decoding operation but provides a column address to the memory device 1100 to re-perform a read operation. When performing the random-out operation, the internal control logic 1210 may change various operation conditions. Embodiments of changing operation conditions will be described in detail with reference to FIGS. 10 to 12.

Figure 10:
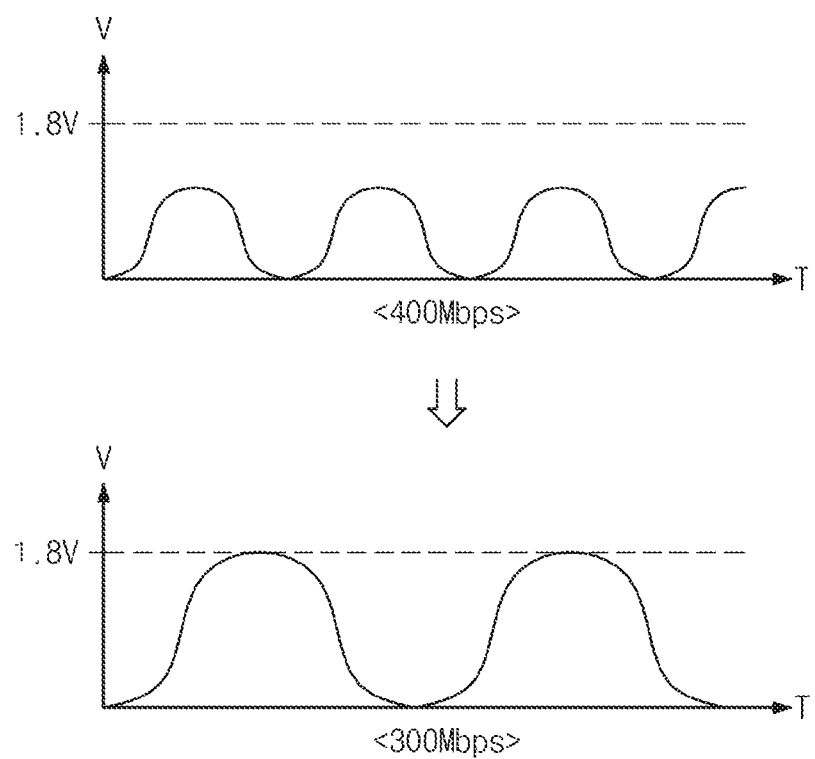
FIG. 10 is a graph illustrating an example of changing an input/output speed of the storage device in FIG. 5.

FIG. 10 is a graph illustrating an example of changing an input/output (I/O) speed of the storage device 1000 in FIG. 5. Hereinafter, an example will be described where an operation voltage of the memory controller 1200 and the memory device 1100 is 1.8 volt. When the speed of reading data from the memory device 1100 by the memory controller 1200 is 400 Mbps, the operation voltage may not fully swing due to a high-speed operation, as shown in FIG. 10. In this case, a specific pattern may mismatch due to a data I/O speed problem.

Even when a specific pattern mismatches, the storage device 1000 may decrease the I/O speed and re-perform a random-out operation, as shown in FIG. 10. For example, when the storage device 1000 decreases the I/O speed to 3000 Mbps, an operation voltage may fully swing to 1.8 volt. When the storage device 1000 decreases the I/O speed and performs the random-out operation, the specific pattern may match.

FIG. 11 illustrates an example of varying a reference voltage of the storage device 1000 in FIG. 5. As illustrated, the memory controller 1200 may include a reference voltage generator 1240. The reference voltage generator 1240 may provide a reference voltage Vref to a pad 1130 of the memory device 1100. The memory device 1100 may generate voltages required for various operations of the memory device 1100 using the reference voltage Vref.

However, there may parasitic resistance Rp or parasitic capacitance at a signal line between the memory controller 1200 and the memory device 1100. In addition, a fabrication process problem or defect may occur at the pad 1130 of the memory device 1100. In this case, the reference voltage Vref provided to the memory device 1100 from the memory controller 1200 may drop. Referring to the example in FIG. 11 where a reference voltage "a" of the memory controller 1200 is 0.9 volt, a reference voltage "b" actually provided to the pad 1130 of the memory device 1100 may decrease to 0.8 volt due to a reason such as parasitic resistance Rp.

When the reference voltage Vref decreases due to parasitic resistance or the like, a specific pattern may mismatch. When the specific pattern mismatches, the storage device 1000 may increase a reference voltage and re-perform a random-out operation, as shown in FIG. 11. For example, when a reference voltage A of the memory controller 1200 increases to 1.0 volt, a reference voltage B of the memory device 1100 may become 0.9 volt although there is parasitic resistance or the like. When the reference voltage Vref increases and the random-out operation is performed, the specific pattern may match.

FIG. 12 is a timing diagram summarizing an example of changing a DQS latency cycle of the storage device 1000 in FIG. 5. Distortion of a DQS signal may occur not only at a first pulse but also at second and third pulses. Due to the distortion of the DQS signal, a specific pattern may mismatch. In this case, the specific pattern mismatch may be resolved when the DQS latency cycle changes from 3 to 4, as shown in FIG. 12. The change of the DQS latency cycle may be made through a set feature operation.

As described above, the storage device 1000 may perform a random-out operation after decreasing I/O speed, increasing a reference voltage Vref or adjusting a DQS latency cycle. Alternatively, when the specific pattern mismatch is not resolved, the storage device 1000 may re-perform the random-out operation after resetting the memory device 1100.

Figure 13:
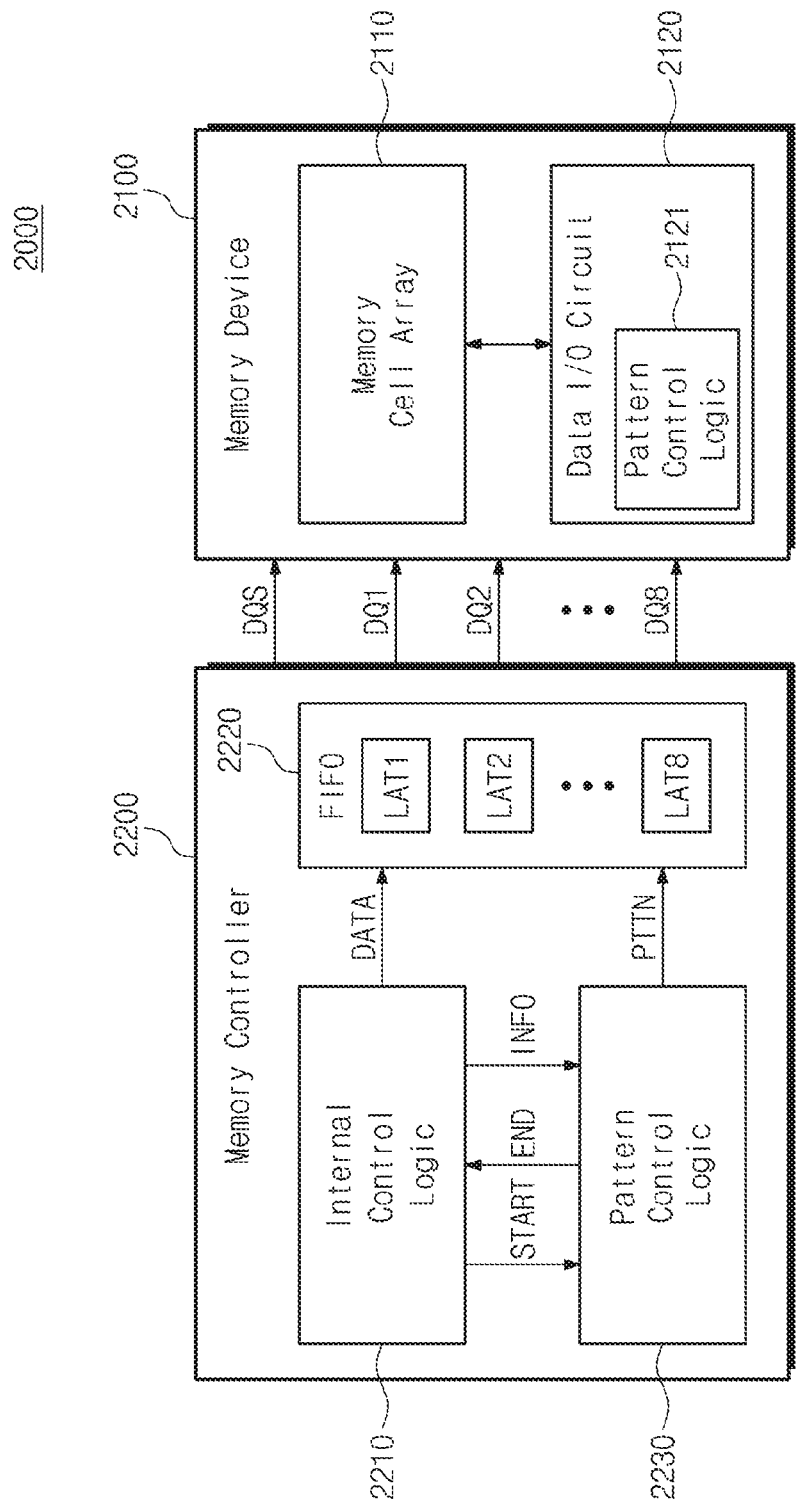
FIG. 13 is a block diagram illustrating a write operation of a storage device according to example embodiments of the disclosure.

FIG. 13 is a block diagram illustrating a write operation of a storage device 2000 according to example embodiments of the disclosure. In FIG. 13, a specific pattern and data DATA are provided to a memory device 2100 from a memory controller 2200. The specific pattern may be established data or may be generated using a block address, a page address, a column address or a seed value. The specific pattern and the data DATA are provided to the memory device 2100 from the memory controller 2200 through data output signals DQ1 to DQ8.

A pattern control logic 2230 of the memory controller 2200 may receive a start signal START from an internal control logic 2210 and generate a specific pattern. The internal control logic 2210 may provide information INFO for the specific pattern, e.g., a block address, a page address, a column address or a seed value. The pattern control logic 2230 may provide an end signal END to the internal control logic 2210 when all specific patterns are generated.

A specific pattern PTTN generated at a pattern control logic 2230 and data DATA output from the internal control logic 2210 may be sequentially stored in latch circuits LAT1 to LAT8 of a first-in-first-out (FIFO) circuit 2220. The specific pattern and the data stored in the FIFO circuit 2220 are provided to the memory device 2100 in alignment with a DQS signal.

A data input/output (I/O) circuit 2120 of the memory device 2100 may receive the specific pattern and the data through the data output signals DQ1 to DQ8. A pattern control logic 2121 of the data I/O circuit 2120 may perform a pattern detection operation. When the specific pattern matches, the data DATA input from the memory controller 2200 may be processed as valid data and stored in the memory cell array 2110.

When the specific pattern mismatches, the pattern control logic 2121 may process a program state as a program failure and provide a pattern mismatch result to the memory controller 2200 through a status bit. The memory controller 2200 may receive the program failure result and re-perform a write operation. When re-performing the write operation, the memory controller 2200 may change various operation conditions.

For example, the memory controller 2200 may re-perform a write operation after decreasing I/O speed. Alternatively, the storage device 2000 may re-perform a write operation after adjusting a reference voltage Vref provided to the memory device 2100 from the memory controller 2200 or after adjusting a DQS latency cycle. Alternatively, the memory controller 2200 may re-perform a write operation after resetting the memory device 2100. An example of changing conditions of a write operation by the memory controller 2200 will be fully understood with reference to the above-described read operation.

Figure 14:
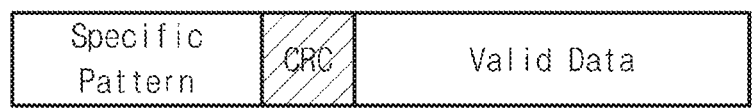
FIG. 14 is an example of adding a CRC to a specific pattern in front of valid data.
Figure 15:
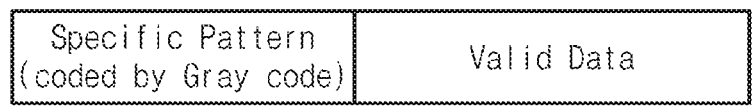
FIG. 15 is a conceptual diagram illustrating an example of implementing a specific pattern with a gray code.

A storage device according to example embodiments of the disclosure may use a cyclic redundancy check (CRC) or a gray code to enhance reliability of a specific pattern. FIG. 14 is an example of adding CRC to a specific pattern in front of valid data, and FIG. 15 is a conceptual diagram illustrating an example of implementing a specific pattern with a gray code.

A storage device according to example embodiments of the disclosure may be applied to various products. The storage device according to example embodiments of the disclosure may be implemented not only with electronic devices such as a personal computer, a digital computer, a camcorder, a handheld phone, an MP3 player, a PMP, a PSP, and a PDA but also with a memory card, a USB memory, a solid state drive (SSD), and the like.

Figure 16:
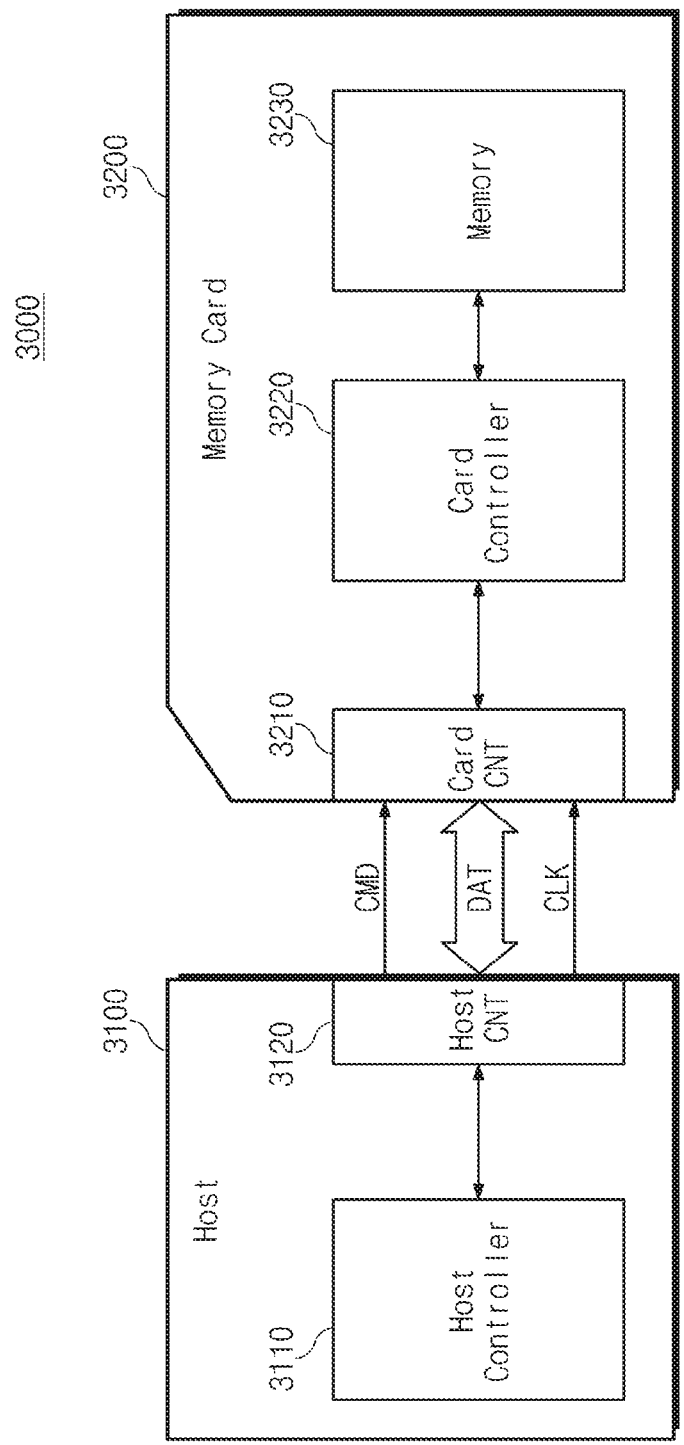
FIG. 16 illustrates an example of applying a storage device to a memory card, according to example embodiments of the disclosure.

FIG. 16 illustrates an example of applying a storage device according to example embodiments of the disclosure to a memory card. As illustrated, a memory card system 3000 may include a host 3100 and a memory card 3200. The host 3100 may include a host controller 3110 and a host connection unit 3120. The memory card 3200 may include a card connection unit 3210, a card controller 3220, and a flash memory 3230.

The host 3100 may write data into the memory card 3200 or may read data stored in the memory card 3200. The host controller 3110 may transmit a command CMD (e.g., write command), a clock signal CLK generated by a clock generator (not shown) in the host 3100, and data DAT through the host connection unit 3120.

Figure 17:
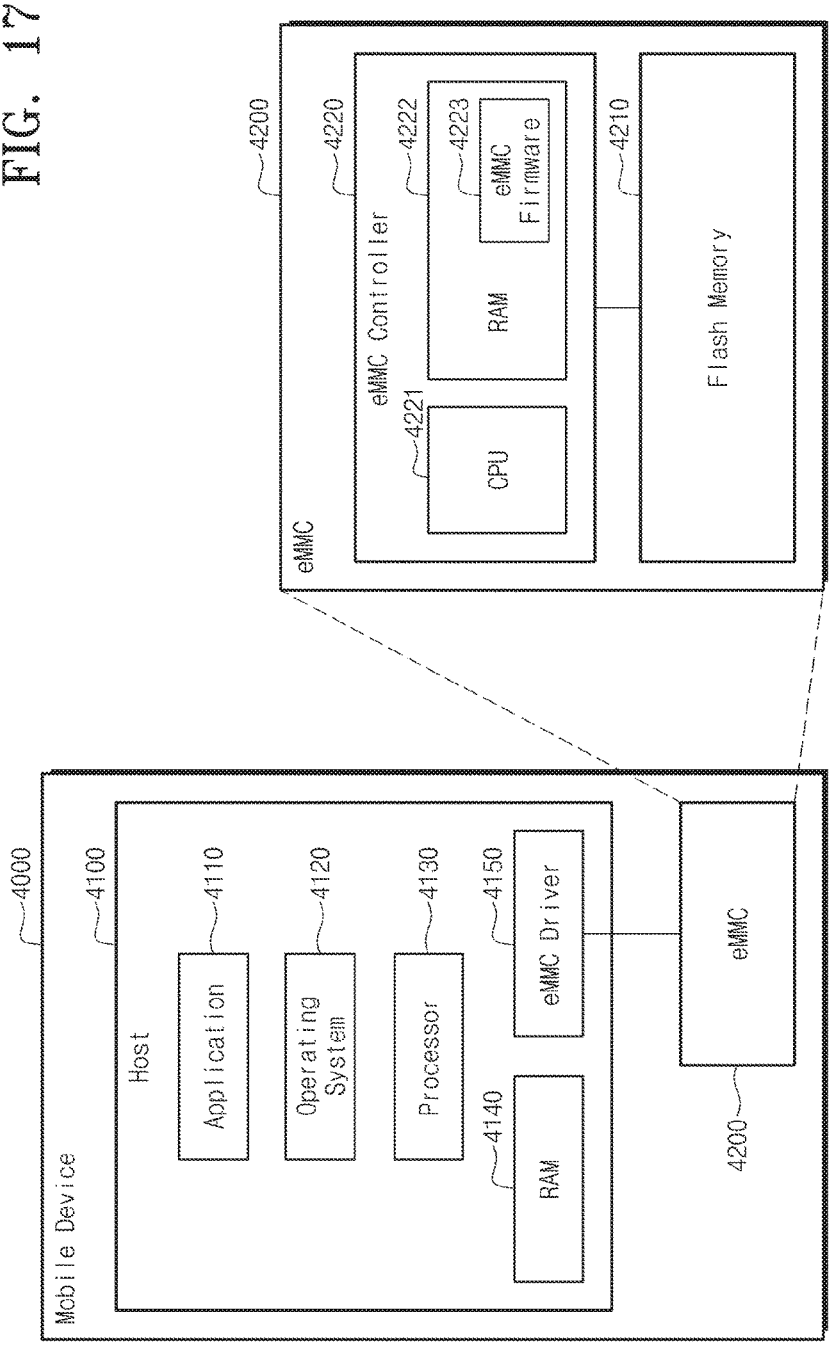
FIG. 17 is a block diagram illustrating a case where a storage device according to example embodiments of the disclosure is used in a mobile device.

The card controller 3220 may store data in the flash memory 3230 in synchronization with a clock signal generated by a clock generator (not shown) in the card controller 3220 in response to a write command received through the card connection unit 3210. The flash memory 3230 may store data transmitted from the host 3100. For example, when the host 3100 is a digital camera, the flash memory 3230 may store image data FIG. 17 is a block diagram illustrating a case where a storage device according to example embodiments of the disclosure is used in a mobile device 4000. As illustrated, the mobile device 4000 includes a host 4100 and an embedded storage device 4200. In FIG. 17, an eMMC is shown as an example of the embedded storage device 4200. The eMMC 4200 may be a memory card defined by the Joint Electron Devices Engineering Council (JEDEC) standards and may be formed of an embedded portable MMC.

The host 4100 may include an application 4110, an operating system (OS) 4120, a processor 4130, a random access memory (RAM) 4140, and an eMMC driver 4150. The eMMC 4200 may include a flash memory 4210 and an eMMC controller 4220. The eMMC controller 4220 may include a central processing unit (CPU) and a random access memory (RAM). The CPU 4221 may drive eMMC firmware 4223 using the RAM 4222.

Figure 18:
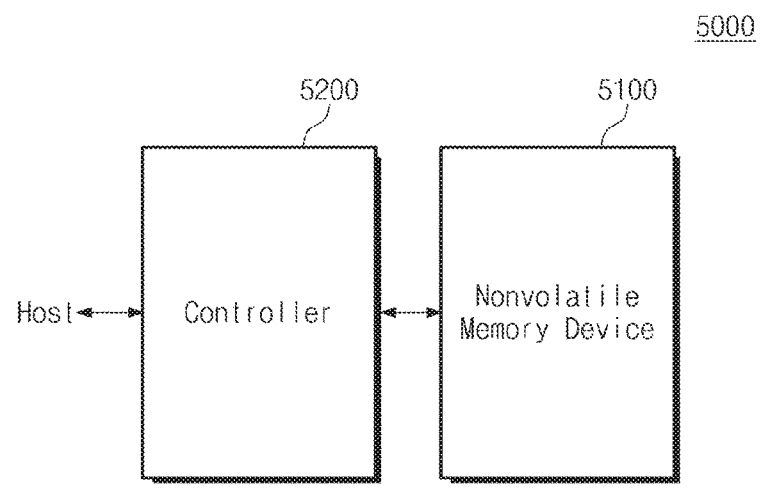
FIG. 18 is a brief block diagram of a storage device according to example embodiments of the disclosure.
Figure 19:
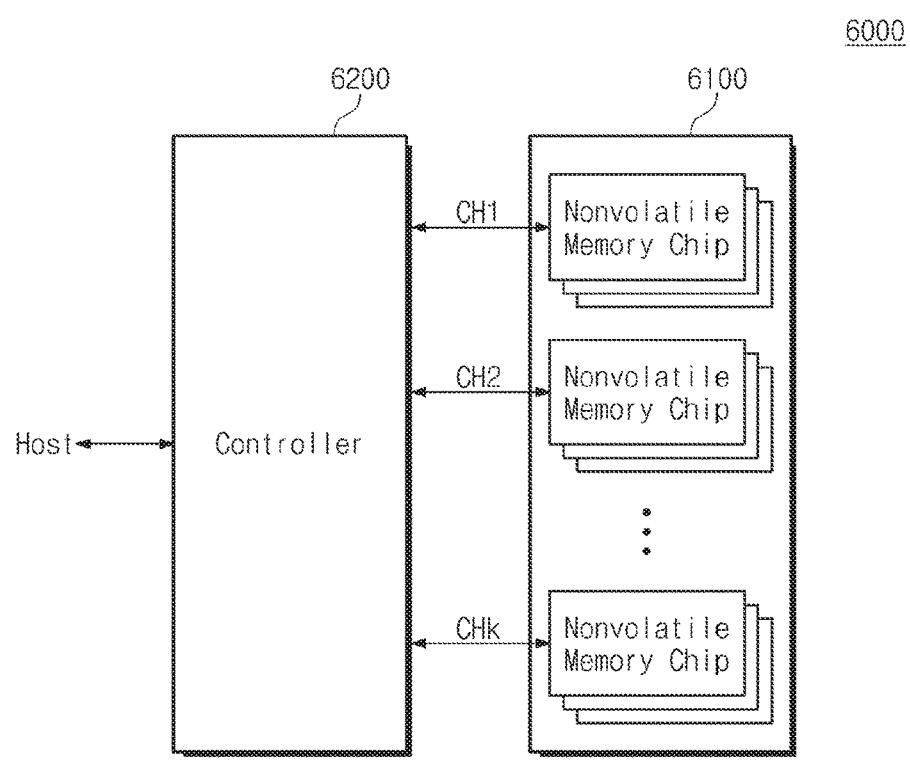
FIG. 19 is a block diagram illustrating an application example of the storage device in FIG. 18.
Figure 20:
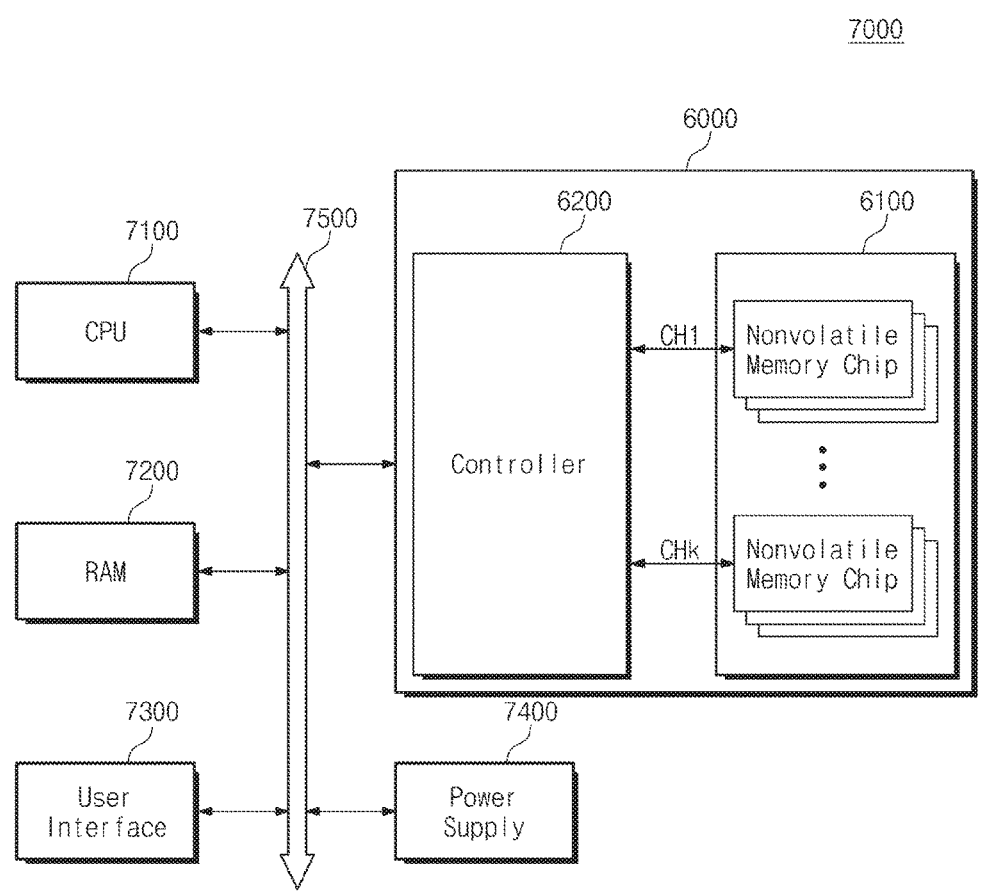
FIG. 20 is a block diagram of a computing system including the storage device described with reference to FIG. 19.

FIG. 18 is a brief block diagram of a storage device 5000 according to example embodiments of the disclosure, and FIG. 19 is a block diagram illustrating an application example of a storage device 6000. FIG. 20 is a block diagram of a computing system 7000 including the storage device 5000 described with reference to FIG. 19.

As illustrated in FIG. 18, the storage device 5000 may include a nonvolatile memory device 5100 and a controller 5200. The controller 5200 and the nonvolatile memory device 5100 may be integrated into a single semiconductor device to constitute the above-mentioned solid state drive (SSD). The SSD may include a storage device configured to store data in a semiconductor memory. When the storage device 5000 is used as an SSD, operation speed of a host connected to the storage device 5000 may be dramatically improved.

The controller 5200 may be connected to the host and the nonvolatile memory device 5100. The controller 5200 may be configured to access the nonvolatile memory device 5100 in response to a request from the host. For example, the controller 5200 may be configured to control read, write, erase, and background operations of the nonvolatile memory device 5100. The controller 5200 may be configured to provide an interface between the memory device 5100 and the host. The controller 5200 may be configured to drive firmware for controlling the nonvolatile memory device 5100.

As illustrated in FIG. 19, the storage device 6000 may include a nonvolatile memory device 6100 and a controller 6200. The nonvolatile memory device 6100 may include a plurality of memory chips. The memory chips are divided into a plurality of groups. Each of the groups may be configured to communicate with the controller 6200 through a single common channel. For example, it is shown that a plurality of nonvolatile memory chips communicate with the controller 6200 through first to kth channels CH1 to CHk. As described in FIG. 19, a plurality of nonvolatile memory chips are connected to a single channel. However, it will be understood that the storage device 6000 may be changed to connect a single nonvolatile memory chip to a single channel.

As illustrated in FIG. 20, the computing system 7000 may include a central processing unit (CPU) 7100, a random access memory (RAM) 7200, a user interface 7300, a power supply 7400, and a storage device 6000.

The storage device 6000 may be electrically connected to the CPU 7100, the RAM 7200, the user interface 7300, and the power supply 7400 through a system bus 7500. Data provided through the user interface 7300 or data processed by the CPU 7100 may be stored in the storage device 6000.

As shown in FIG. 20, the nonvolatile memory device 6100 is connected to the system bus 7500 through a controller 6200. However, the nonvolatile memory device 6100 may be configured to be directly connected to the system bus 7500. As shown in FIG. 20, the storage device 6000 described with reference to FIG. 19 is provided. However, the storage device 6000 may be replaced with the storage device 5000 described with reference to FIG. 18. In example embodiments, the computing system 7000 may be configured to include both the storage devices 5000 and 6000 described with reference to FIGS. 18 and 19.

As described above, a storage device according to example embodiments of the disclosure adds a specific pattern to a dummy DQS cycle and processes data input following the dummy DQS cycle as valid data. Thus, valid data may be prevented from being mistakenly processed as dummy data or invalid data.

The above-disclosed subject matter is to be considered illustrative, and not restrictive, and the appended claims are intended to cover all such modifications, enhancements, and other features, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A storage device comprising:
a memory device configured to store data; and a memory controller connected to the memory device through a data strobe line and a plurality of data lines, and configured to communicate the data through the plurality of data lines and to communicate a data strobe signal through the data strobe line, wherein a predetermined specific pattern is added to the data in front of the data, and wherein at least one of the memory device and the memory controller is configured to compare the predetermined specific pattern to an internally stored specific pattern to provide a comparison result, and to process the data sequentially following the predetermined specific pattern as valid data during a read operation or write operation based on the comparison result.

2. The storage device as set forth in claim 1, wherein the predetermined specific pattern is provided in alignment with a data strobe signal latency cycle.

3. The storage device as set forth in claim 1, wherein the memory controller is configured to receive the data including the predetermined specific pattern from the memory device, detect the predetermined specific pattern during the read operation, and process the data sequentially following the detected predetermined specific pattern as the valid data when the detected predetermined specific pattern matches the internally stored specific pattern.

4. The storage device as set forth in claim 3, wherein the memory controller is configured to process the data sequentially following the detected predetermined specific pattern as the valid data even when some, but not all, of the detected predetermined specific pattern matches the internally stored specific pattern.

5. The storage device as set forth in claim 3, wherein the memory controller is configured to recognize a mismatch of the detected predetermined specific pattern with the internally stored specific pattern as a malfunction, and perform a random-out operation responsive to the mismatch.

6. The storage device as set forth in claim 5, wherein the memory controller is configured to perform the random-out operation after changing a data input/output speed of the memory device, changing a reference voltage provided to the memory device, changing a data strobe signal latency cycle, or resetting the memory device.

7. The storage device as set forth in claim 6, wherein the memory controller is configured to change the data strobe signal latency cycle through a set feature operation.

8. The storage device as set forth in claim 1, wherein the memory device is configured to receive the data including the predetermined specific pattern from the memory controller, detect the predetermined specific pattern input during the write operation, and process the data sequentially following the detected predetermined specific pattern as the valid data when the detected predetermined specific pattern matches the internally stored specific pattern.

9. The storage device as set forth in claim 8, wherein the predetermined specific pattern includes at least one of a block address, a page address, a column address provided from the memory controller, and any combination thereof, or a seed value provided from the memory controller.

10. The storage device as set forth in claim 8, wherein the memory device is configured to recognize a mismatch of the detected predetermined specific pattern with the internally stored specific pattern as a malfunction, process a program state as a program failure, and provide the comparison result indicative of a pattern mismatch result to the memory controller through a status bit responsive to the mismatch.

11. The storage device as set forth in claim 10, wherein the memory controller is configured to re-perform the write operation after changing a data input/output speed of the memory device, changing a reference voltage provided to the memory device, changing a data strobe signal latency cycle, or resetting the memory device responsive to receiving the comparison result indicative of the pattern mismatch from the memory device.

12. The storage device as set forth in claim 1, wherein the memory device comprises a flash memory including a three-dimensional memory array.

13. The storage device as set forth in claim 1, wherein a cyclic redundancy check is added to the predetermined specific pattern.

14. The storage device as set forth in claim 1, wherein the predetermined specific pattern is coded by a gray code.

15. An operating method of a storage device including a memory device configured to store data, and a memory controller connected to the memory device through a data strobe line and a plurality of data lines, the operating method comprising:

generating a predetermined specific pattern;

providing the predetermined specific pattern through the plurality of data lines in alignment with a dummy data strobe signal provided through the data strobe line; and providing data through the plurality of data lines in alignment with a data strobe signal provided through the data strobe line, sequentially after providing the predetermined specific pattern, wherein the data sequentially after the predetermined specific pattern is processed as valid data when at least a portion of the predetermined specific pattern is determined to match a corresponding portion of a previously established pattern.

16. A memory device comprising:

a memory cell array that stores data; and a data input/output (I/O) circuit configured to receive a predetermined specific pattern via a plurality of data lines in alignment with a dummy data strobe signal received via a data strobe signal line, receive the data via the plurality of data lines in alignment with a data strobe signal received via the data strobe signal line, the received data sequentially following the received predetermined specific pattern, identify a pattern match when at least a portion of the received predetermined specific pattern is determined to match a corresponding portion of an internally stored specific pattern, and process the received data as valid data when the pattern match is identified.

17. The memory device of claim 16, wherein the data I/O circuit is configured to store the received data in the memory cell array when the pattern match is identified.

18. The memory device of claim 16, wherein the memory device is a storage device that stores information under control of a memory controller, and the data I/O circuit is configured to inform the memory controller of a pattern mismatch when the pattern match is not identified, and change a data input/output speed of subsequent communication with the memory controller, an expected data strobe signal latency cycle for the data strobe signal subsequently received from the memory controller, or an operational state of the storage device in response to receiving an instruction identifying the change from the memory controller.

19. The memory device of claim 18, wherein upon making the change identified by the instruction, the data I/O circuit is configured to
   receive the predetermined specific pattern in alignment with another dummy data strobe signal from the memory controller,
   receive the data in alignment with another data strobe signal from the memory controller upon completely receiving the predetermined specific pattern in alignment with the another dummy data strobe signal,
   identify the pattern match when at least a portion of the predetermined specific pattern received in alignment with the another dummy data strobe signal is determined to match the corresponding portion of the internally stored specific pattern, and
   store the data received in alignment with the another data strobe signal in the memory cell array of the storage device when the pattern match is identified.

20. The memory device of claim 16, wherein the memory device is a memory controller that controls a storage device to store information, and
   the memory controller is configured to inform the storage device to change a data input/output speed with which the storage device communicates with the memory controller, change a reference voltage provided to the storage device, inform the storage device to change a data strobe signal latency cycle of a data strobe signal subsequently communicated by the storage device, or reset the storage device when the pattern match is not identified.

* * * * *